United States Patent [19]
Karniewicz

[11] Patent Number: 5,135,882
[45] Date of Patent: Aug. 4, 1992

[54] TECHNIQUE FOR FORMING HIGH-VALUE INTER-NODAL COUPLING RESISTANCE FOR RAD-HARD APPLICATIONS IN A DOUBLE-POLY, SALICIDE PROCESS USING LOCAL INTERCONNECT

[75] Inventor: Joseph J. Karniewicz, Boise, Id.

[73] Assignee: Micron Technology, Inc., Boise, Id.

[21] Appl. No.: 680,224

[22] Filed: Apr. 4, 1991

Related U.S. Application Data

[63] Continuation-in-part of Ser. No. 388,073, Jul. 31, 1989, abandoned.

[51] Int. Cl.[5] .............................................. H01L 21/70
[52] U.S. Cl. ..................................... 437/52; 437/47; 437/48; 437/60; 437/200; 437/918; 357/51
[58] Field of Search ............... 437/47, 48, 52, 60, 437/191, 193, 195, 192, 200, 918; 357/51

[56] References Cited

U.S. PATENT DOCUMENTS

| | | | |
|---|---|---|---|
| 4,451,328 | 5/1984 | Dubois | 437/918 |
| 4,581,815 | 4/1986 | Cheung et al. | 437/200 |
| 4,657,628 | 4/1987 | Holloway et al. | 437/200 |
| 4,804,636 | 2/1989 | Groover, III et al. | 437/200 |
| 4,968,645 | 9/1990 | Baldi et al. | 437/918 |

FOREIGN PATENT DOCUMENTS

0031441 2/1989 Japan.

Primary Examiner—Brian E. Hearn
Assistant Examiner—Tom Thomas
Attorney, Agent, or Firm—Angus C. Fox, III

[57] ABSTRACT

A technique for forming high-value, inter-nodal, polysilicon coupling resistors using self-aligned silicidation and local interconnect in a double polysilicon process. In an SRAM memory, the technique may be utilized to interconnect the gates of each CMOS invertor to created radiation-hardened cells. Process flow is conventional through gate formation, with transistor gates being patterned from a first polysilicon (poly-1) layer. The transistors which will form each invertor are constructed on distinct active areas. The gate of each invertor transistor extends beyond an edge of the field oxide region, such that an end portion of each gate is superjacent different portions of a single field oxide region. These gate end portions are separated by an expanse of exposed field oxide. The process then departs from convention with a blanket silicon nitride deposition, followed by blanket deposition of a second polysilicon (poly-2) layer. The poly-2 layer is then doped to a desired resistance, then patterned to create a resistive element for the local interconnect. Each invertor gate is connected to the resistive element during the normal flow of the local interconnect process. Preservation of the high resistance of the resistive element is maintained by means of a silicide-isolation oxide film which is created on all but the ends of the resistive element where interconnection to the invertor gates is made. By decoupling the function of the poly-1 and poly-2 layers, the problem of grain-boundary-assisted diffusion between heavily-doped and lightly-doped regions of a contiguous single-poly strip is eliminated. Hence, standard phosphine doping may be used for the poly-1 layer and blanket doping may be used for the poly-2 layer.

5 Claims, 8 Drawing Sheets

TECHNIQUE FOR FORMING HIGH-VALUE INTER-NODAL COUPLING RESISTANCE FOR RAD-HARD APPLICATIONS IN A DOUBLE-POLY, SALICIDE PROCESS USING LOCAL INTERCONNECT

This application is a continuation-in-part of application Ser. No. 07/388,073 that was filed on Jul. 31, 1989, now abandoned.

FIELD OF THE INVENTION

This invention relates to semiconductor devices. More specifically, it is related to processes for creating high-value, inter-nodal coupling resistors for radiation-hardened memory applications.

BACKGROUND OF THE INVENTION

Static random access memories (SRAMs), when used in certain applications such as satellite communications and tactical weapons, require a high degree of immunity from single event upsets (SEUs). An SEU results in the corruption of data known as a "soft error", and is the result of a charged particle radiation hit on a charged node within the cell. Although both static and dynamic random access memories are vulnerable to SEUs, this discussion will be limited to SRAMs.

Figure 1:
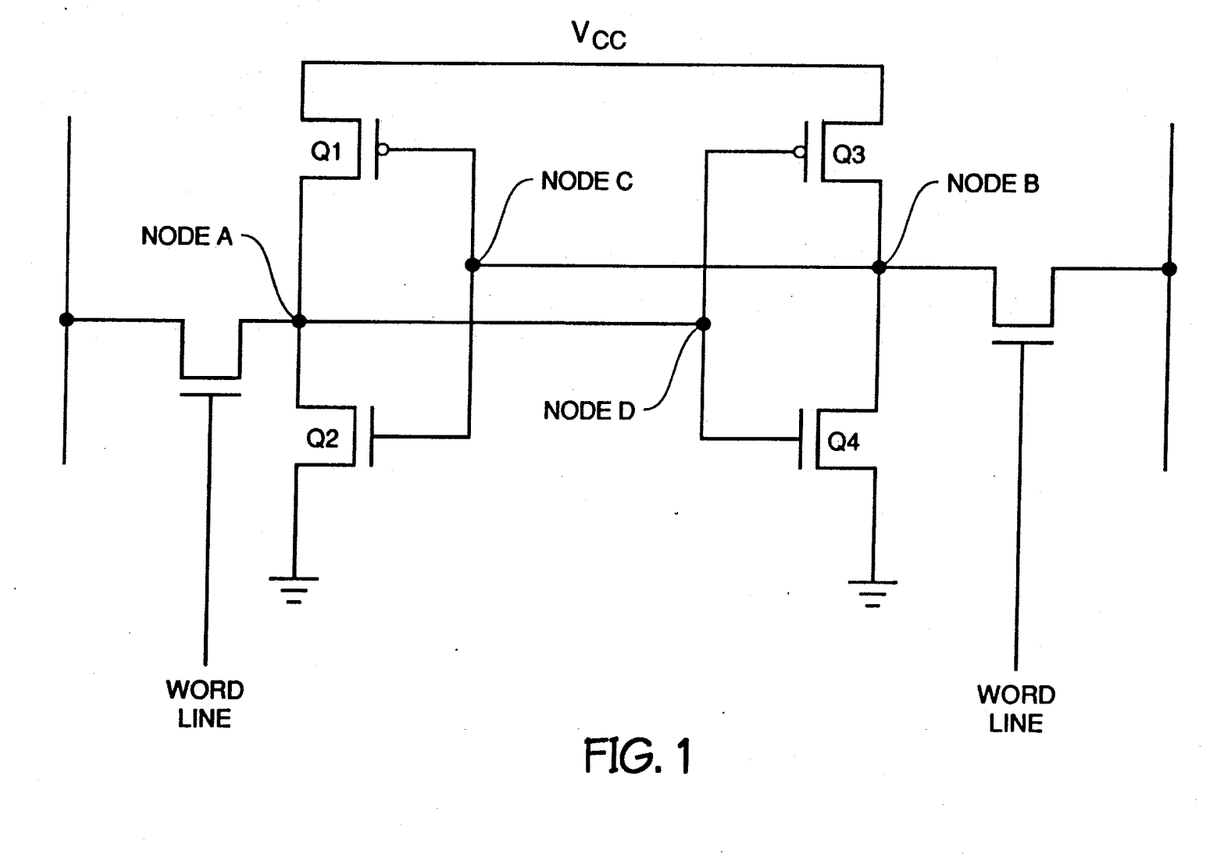
FIG. 1 is a schematic diagram of a six-transistor SRAM cell.

FIG. 1 is a schematic representation of a typical cross-coupled six-transistor SRAM cell. Let us assume that, with transistors Q1 and Q4 turned on, transistors Q2 and Q3 turned off, both NODE A and NODE D at a Vcc voltage of +5 volts, and both NODE B and NODE C grounded to 0 volts, an information bit value of "1" is stored within the cell. If a charged particle of radiation (such as an alpha particle) were to impact NODE A, hole-electron pairs would be generated in the cell substrate, which would allow the charge on NODE A to partially or completely dissipate. This reduction in charge on NODE A will propagate to NODE D at a rate faster than transistor Q1 can recharge NODE A. If the charge on NODE A has dropped to near 0 volts, the charge on NODE D will be pulled rapidly to near 0 volts, causing transistor Q3 to turn on and transistor Q4 to turn off. NODE B and NODE C will then be charged to Vcc, thus turning transistor Q1 off and transistor Q2 on. This new latched state of the cell will no longer represent a bit value of "1", but rather a bit value of "0". By definition, an SEU has occurred.

A cross-coupled resistor design has been used extensively for the past several years to dramatically reduce the soft error rate of SRAM cells. By connecting resistors having a resistance on the order of 100K ohms between opposite nodes of the four-transistor storage latch, the cross-coupling RC time constant is increased. In the circuit of FIG. 1, one resistor would be placed between NODE A and NODE D, while another would be placed between NODE B and NODE C. Such a design modification will delay the propagation of a rapid change in voltage on one side of two interconnected nodes by several nanoseconds. Thus, in our example of a hit on NODE A, transistor Q1 will restore the +5 volt charge to NODE A before its SEU-induced low-voltage charge can create a latch-reversing voltage change at NODE D.

In the past, various processes have been used to create these high-value inter-nodal coupling resistors from the same layer of polycrystalline silicon (poly) that is used to form the gates of the cell's transistors. While such processes are generally successful for lower integration levels, they are beset by a number of drawbacks as device dimensions shrink at higher integration levels. One of the drawbacks is the inability to accurately control grain-boundary-assisted diffusion between the heavily-doped regions destined to be transistor gates and the lightly-doped regions destined to be inter-nodal coupling resistors within the single poly layer. Such diffusion can dramatically change the sheet resistance value of the resistor poly regions, and in extreme cases may even alter the work function of the gate poly regions, which affects threshold voltage. Another drawback is the inability to vary the thickness of the resistive layer independently of the gate layer, since they are one and the same. Hence, thickness is not available as a degree of freedom for controlling the final sheet resistance. An additional drawback is the necessity of using a masked implant to obtain two regions of different dopant concentration in the poly-1 layer before it is patterned.

In order to increase the operating speed of SRAMs, the diffusion and polysilicon interconnect regions are silicided with titanium in a self-aligned process, commonly referred to as a salicide process.

The processing of low sheet resistance salicided poly for speed and high sheet resistance unsalicided poly for radiation tolerance are inconsistent with one another unless a unique process flow is created which can simultaneously accommodate these disparate elements.

It would be highly desirable to develop a process for creating inter-nodal coupling resistors which is more compatible with high-speed/high-density circuit design, and which eliminates the problems discussed above.

SUMMARY OF THE INVENTION

The present invention describes a process flow which can simultaneously satisfy the requirements of both high-speed/high-density circuit design and those of single event upset immunity as required in radiation-tolerant circuit design.

The high speed/high density circuit requirements are met by a process flow which utilizes self-aligned silicidation of source, drains, and gates (salicide) as well as the local interconnect that results from the silicidation process.

The salicide process reduces the sheet resistance of poly and active interconnects, thus lowering the RC time constants and therefore increasing speed. The salicide local interconnect process provides a method for interconnecting the active areas and gate pairs without resorting to space consuming buried or top side contacts which decrease circuit density.

This invention is primarily concerned with the process of creating the inter-nodal coupling resistors which provide radiation tolerance to an SRAM cell, and incorporating those resistors into the local interconnect scheme. Process flow is conventional through gate formation, with transistor gates being patterned from a first polysilicon (poly-1) layer. The transistors which will form each invertor are constructed on distinct active areas. The gate of each invertor transistor extends beyond an edge of the field oxide region, thus forming gate extensions which are superjacent different portions of said field oxide region. These gate extensions are separated by an expanse of exposed field oxide. The process then from convention with a blanket silicon nitride deposition, followed by blanket deposition of a second polysilicon (poly-2) layer. The poly-2 layer is then doped to a desired resistance, then patterned to create a resistive element for the local interconnect. Each invertor gate is connected to the resistive element during the normal flow of the local interconnect process. Preservation of the high resistance of the resistive element is maintained by means of a silicide-isolation oxide film which is created on all but the ends of the resistive element where interconnection to the invertor gates is made.

This process flow is unique in that it decouples the function of the poly-1 and poly-2 layers. The poly-1 layer can be patterned and doped to meet the requirements of the active N-channel and P-channel transistors. Standard phosphine doping of the poly-1 layer can be used, since no lightly doped regions are required in the poly-1 layer. The thickness of the poly-1 layer can be optimized for the salicide process, and there is no possibility of changes in poly work function and resultant shifts in device characteristics due to diffusion between the high- and low-doped regions across poly grain boundaries. The poly-2 layer, on the other hand, can be optimized solely for its role as a high resistance poly layer. It can be blanket-implanted as opposed to mask-implanted. Also, its resistance will not change during formation as a result of diffusion from high- to low-doped regions. In addition, its thickness can be varied to give another degree of freedom to achieve the required sheet resistance for SEU immunity. It will also be easier via this second degree of freedom to simultaneously optimize the sheet resistance and thermal resistance coefficient to achieve the most stable resistor possible within the specified resistance range.

PREFERRED EMBODIMENT OF THE INVENTION

Figure 2:
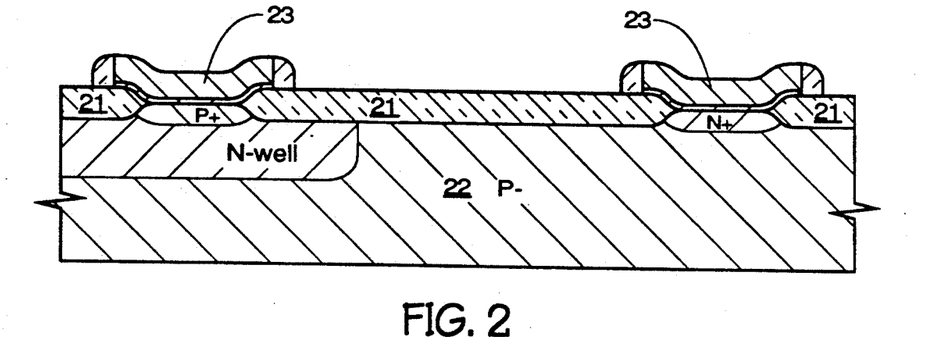
FIG. 2 is a cross-sectional view of an in-process wafer portion, showing key topographical elements during the fabrication of a typical SRAM cell following creation of an N-well on a P-type substrate, growth of field oxide regions, deposition, patterning and etching of a poly-1 layer to create FET gates, and creation of P-channel and N-channel regions.

Referring now to FIG. 2, which is a cross-sectional view of an in-process wafer portion, key topographical elements during the fabrication of a typical inverter within an SRAM cell are depicted. At this stage in the manufacturing process, an N-well has been created on a P-type substrate 22, following which field oxide regions 21 were created. A first polysilicon (poly-1) layer was then deposited, patterned and etched to create gates 23 for N-channel and P-channel insulated-gate field-effect transistors (IGFETS), the channel regions of which were subsequently formed by implanting N-type and P-type impurities, respectively, in active areas. It will be noted that each transistor gate 23 extends beyond an edge of the field oxide region 21, such that an end portion of each gate is superjacent different portions of the central field oxide region. These gate end portions are separated by an expanse of exposed field oxide, on which will be constructed a high-resistance, inter-nodal coupling resistor.

Figure 3:
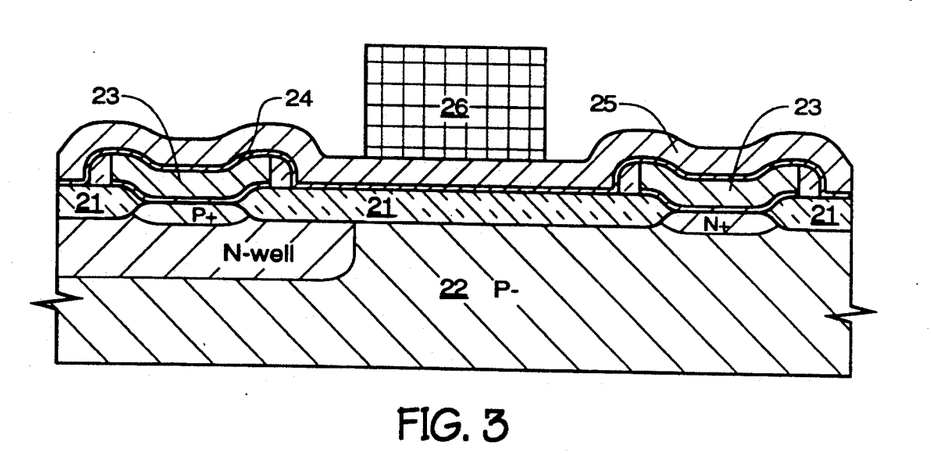
FIG. 3 is the cross-sectional view of FIG. 2, following the deposition of a first silicon nitride layer, and the deposition, implanting and photoresist masking of a poly-2 layer.

Referring now to FIG. 3, a first silicon nitride layer 24 some 100 angstroms thick is blanket deposited on the upper surface of the in-process wafer, following which a 2000 angstrom-thick poly-2 layer 25 is blanket deposited on top of first nitride layer 24, implanted with phosphorus to set the sheet resistance, and patterned with a first photoresist mask 26.

Figure 4:
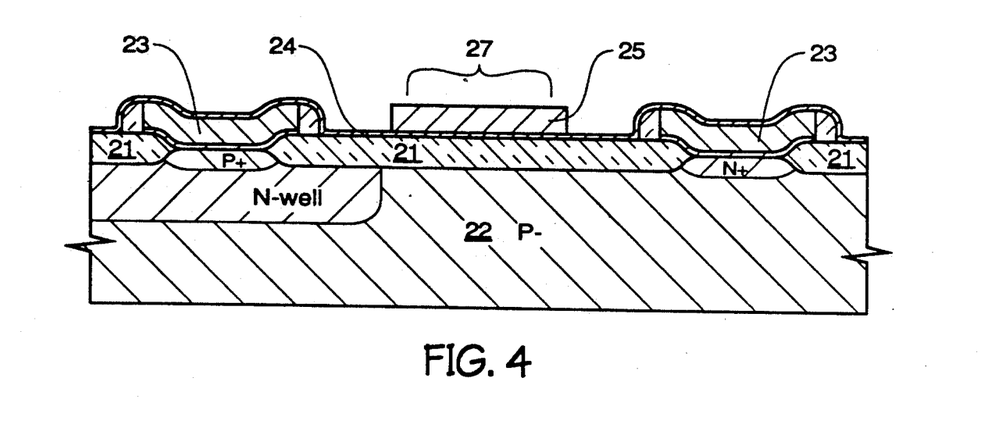
FIG. 4 is the cross-sectional view of FIG. 3, following an etch of the poly-2 layer and a photoresist strip.

Referring now to FIG. 4, poly-2 layer 25 has been etched, and first photoresist mask 26 has been stripped, leaving a remnant of poly-2 layer 25 that will incorporate the resistive element of the desired inter-nodal coupling resistor. The remnant of poly-2 layer 25 is, essentially, strip of poly-2 material having a pair of end regions (the portions of the strip outside central region 27 which will become the resistive element of the resistor). It will be noted that the poly-2 strip is entirely superjacent the central field oxide region, and it is not in intimate contact with either of transistor gates 23.

It is now necessary to create an oxide isolation layer over those portions 27 of the strips formed from doped poly-2 layer 25 which will become the high-resistance elements of the coupling resistors. The function of this isolation layer will be explained in later commentary. There are at least two viable techniques for accomplishing this task. Once this isolation layer has been created, the subsequent processing is common to both techniques.

Figure 5:
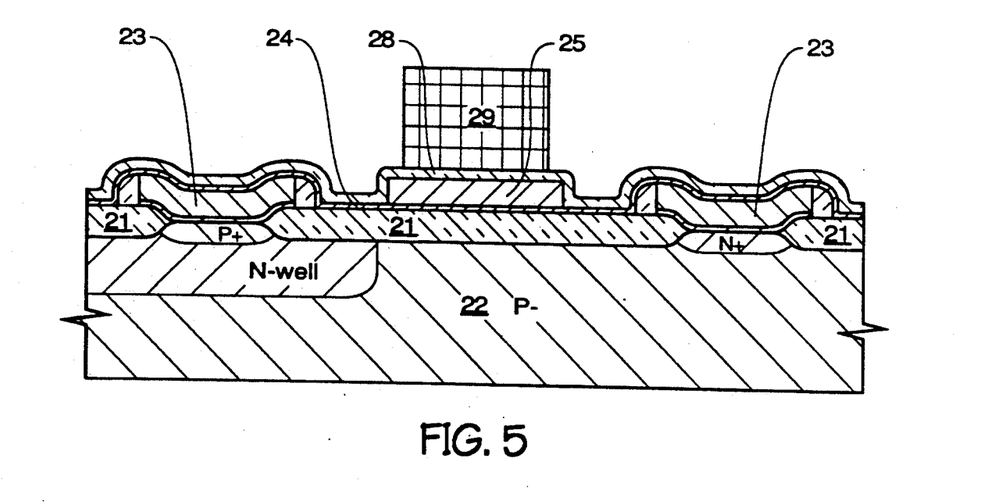
FIG. 5 is the cross-sectional view of FIG. 4, following the deposition and photoresist masking of a TEOS isolation layer.

Referring now to FIG. 5, a first method of creating an oxide isolation layer begins with the blanket deposition of a triethyleneoxysilane (TEOS) oxide isolation layer 28 on the upper surface of the in-process wafer. This TEOS oxide isolation layer 28 is patterned with a second, primary embodiment photoresist mask 29.

Figure 6:
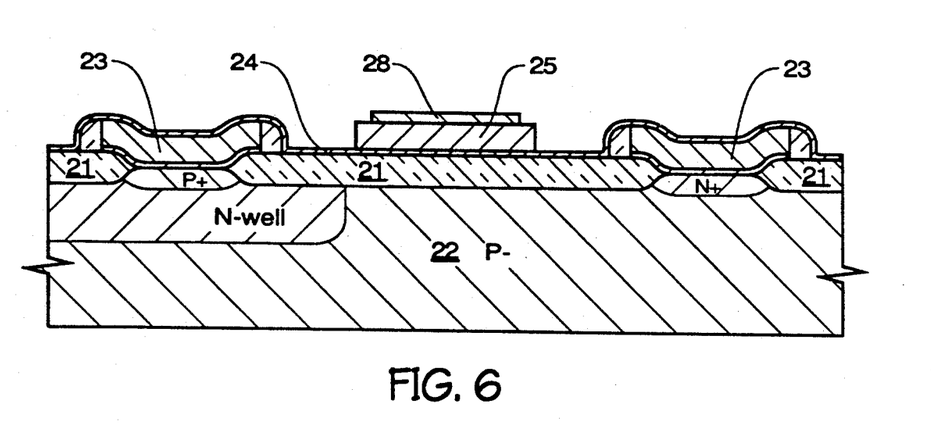
FIG. 6 is the cross-sectional view of FIG. 5, following an etch of the TEOS isolation layer and a photoresist strip

Referring now to FIG. 6, TEOS oxide isolation layer 28 has been etched, and second photoresist mask 29 has been stripped. A remnant of TEOS oxide isolation layer 28 remains on top of the remnant of poly-2 layer 25, the TEOS oxide layer remnant being superjacent the portion 27 (see FIG. 5) of the poly-2 layer remnant that will form the resistive element of the desired inter-nodal coupling resistor.

Figure 7:
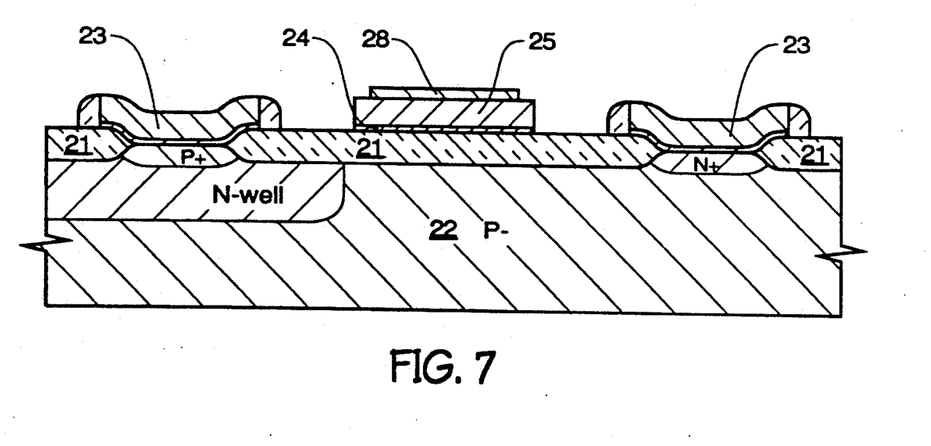
FIG. 7 is the cross-sectional view of FIG. 6, following the etching away of those portions of the first silicon nitride layer that were not subjacent the poly-2 layer remnant.

Referring now to FIG. 7, those portions of the first silicon nitride layer that were not subjacent the remnant of poly-2 layer 25 have been etched away. The process resumes with FIG. 12.

Figure 8:
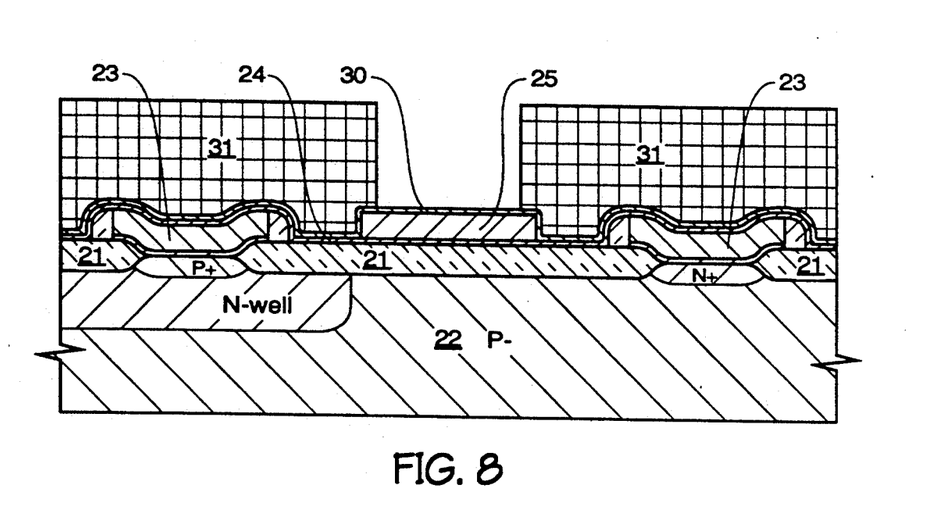
FIG. 8 is the cross-sectional view of FIG. 4, following the deposition and masking of a second nitride layer with photoresist.

FIG. 8 depicts the beginning of an alternative process for creating an oxide isolation layer over the portions 27 (see FIG. 5) of poly-2 layer 25 which will become the high-resistance elements of the coupling resistors. This task was performed by TEOS oxide isolation layer 28 in a first process sequence that is depicted in FIGS. 5 and 6. The alternative process sequence proceeds with the deposition of a second silicon nitride layer 30 over the surface of the cell and masking it with an alternative embodiment second photoresist mask 31.

Figure 9:
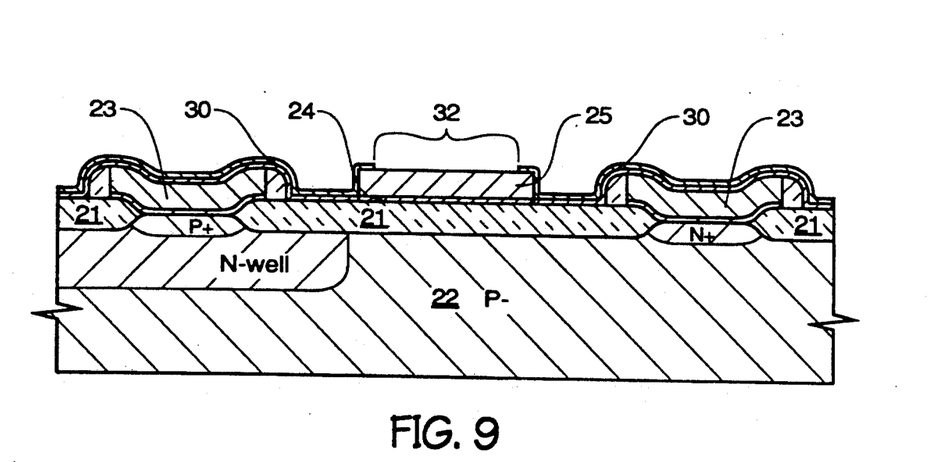
FIG. 9 is the cross-sectional view of FIG. 8, following an etch of the second nitride layer and a photoresist strip.

Referring now to FIG. 9, which is a continuation of the sequence begun in FIG. 8, second nitride layer 30 has been etched, exposing a portion 32 of poly-2 layer 25. Following the etching of second nitride layer 30, third photoresist mask 31 is stripped.

Figure 10:
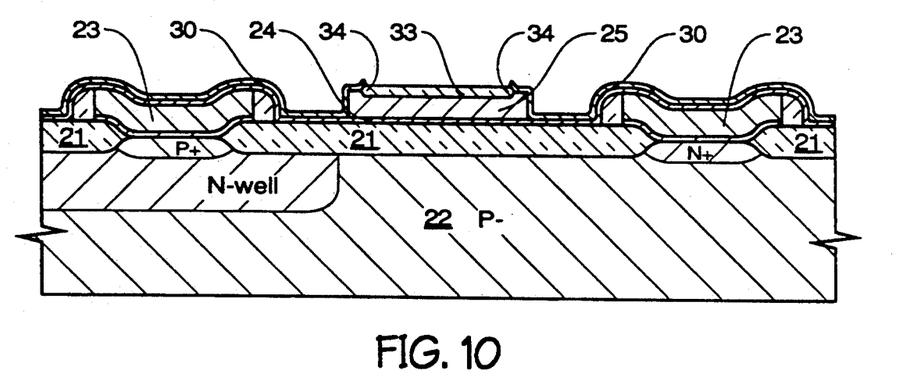
FIG. 10 is the cross-sectional view of FIG. 9, following the high-pressure growth of oxide (Hi-POX) on the exposed portion of the poly-2 layer remnant.

FIG. 10, which continues with the sequence begun in FIG. 8, depicts a layer of high-pressure oxide (Hi-POX) 33, which has been grown on the exposed portion 32 of poly-2 layer 25. Although grown Hi-POX oxide layer 33 is semi-recessed (in relation to poly-2 layer 25) and has bird's beak regions 34 at its edges, it will serve the same function as the deposited TEOS oxide layer.

Figure 11:
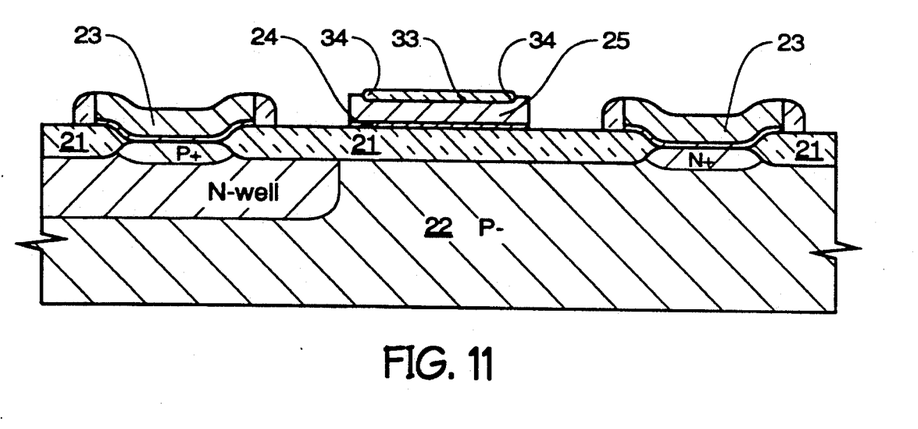
FIG. 11 is the cross-sectional view of FIG. 10, following the etching away of all portions of the second silicon nitride layer and those portions of the first silicon nitride layers that were not subjacent the poly-2 layer remnant.

Referring now to FIG. 11, which is a continuation of the sequence begun in FIG. 8, those portions of first silicon nitride layer 24 that were not subjacent the remnant of poly-2 layer 25, as well as all remaining portions of the second silicon nitride layer 30 have been etched away. The remaining steps for the sequence which has ended with FIG. 11 and the sequence which ended with FIG. 7 are common. Although FIGS. 7 and 11 are not identical, they are functionally equivalent. As a result, the remainder of the process will utilize the in-process wafer portion of FIG. 7 for completion of the sequence.

Figure 12:
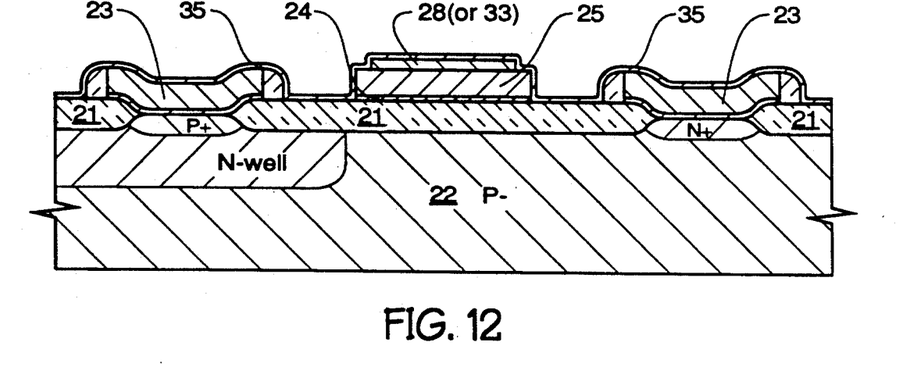
FIG. 12 is the cross-sectional view of either FIG. 7 or FIG. 11, following sputter deposition of a titanium layer.

Referring now to FIG. 12, the in-process wafer, a portion of which is depicted in either FIGS. 7 or 11 has been subjected to a blanket sputter deposition of a metallic titanium layer 35. The oxide isolation layer, whether formed from TEOS-deposited oxide (layer 28) or Hi-POX grown oxide (layer 33) acts to isolate those portions of poly-2 layer 25 that must maintain their high-resistance in the face of the resistance-reducing self-aligned titanium silicide (salicide) process, which proceeds with the sputter deposition, sintering and annealing of metallic titanium layer 35.

Figure 13:
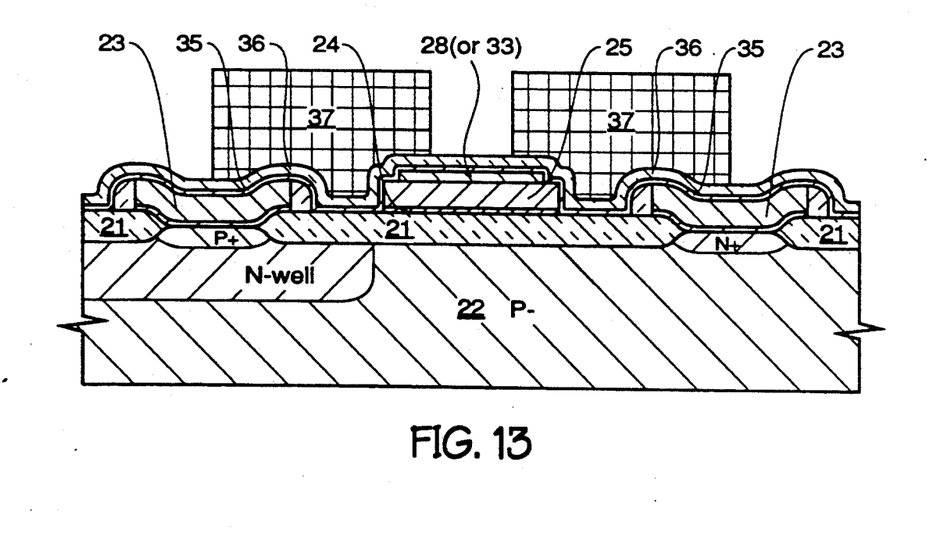
FIG. 13 the cross-sectional view of FIG. 12, following the sintering of the titanium layer, deposition and photoresist masking of a TEOS patterning layer.

Referring now to FIG. 13, titanium layer 35 has been subjected conventional sintering at elevated temperature in a nitrogen ambient, thus converting the titanium layer to a layer of titanium silicide overlaid by a layer of titanium nitride wherever it is in intimate contact with silicon (whether polysilicon or mon-crystalline substrate) and to titanium nitride wherever it overlies silicon dioxide. Following the sintering step, a TEOS oxide patterning layer 36 is blanket deposited on the upper surface of the in-process wafer and patterned with a third photoresist mask 37 which defines a local interconnect pattern which will connect each gate to only one end portion of the poly-2 strip 25.

Figure 14:
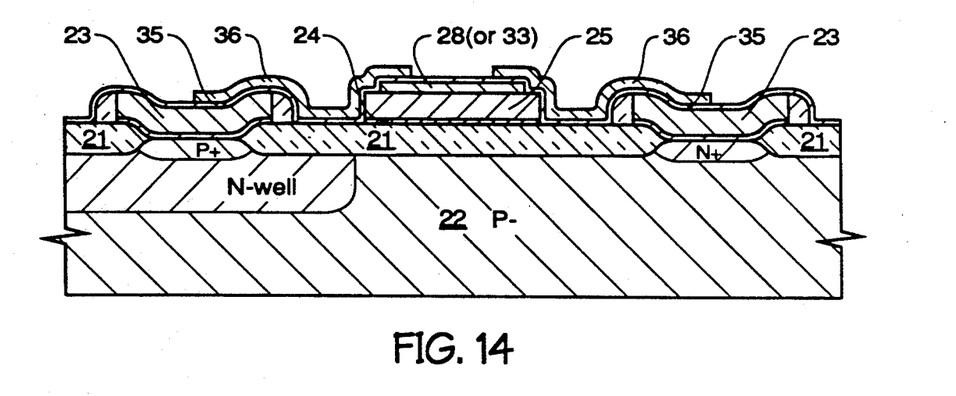
FIG. 14 is the cross-sectional view of FIG. 13, following an etch of the TEOS patterning layer and photoresist strip.

Referring now to FIG. 14, the exposed portions of TEOS oxide patterning layer 36 have been etched away and third photoresist mask 37 has been stripped.

Figure 15:
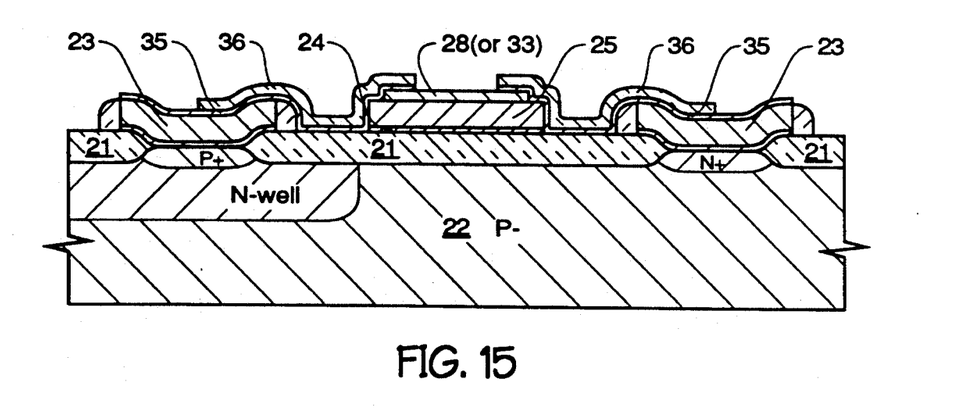
FIG. 15 is the cross-sectional view of FIG. 14, following the etch of the exposed portions of titanium nitride (which resulted from the sintering of titanium over oxide) and the annealing of the remaining sintered titanium layer.

Referring now to FIG. 15, the exposed portions of the titanium nitride, which resulted from the sintering of titanium layer 35 over oxide, have been etched away, following which the remaining portions of sintered titanium layer 35 are annealed. The formation of both the high-value inter-nodal coupling resistors and the interconnect lines are now complete. FIG. 15, of course, depicts only a single inverter within a single cell within an entire array that has been subjected to the process heretofore described. In FIG. 15, a pair of interconnect lines have been formed from the sintered and annealed titanium layer 35. Each interconnect line connects a transistor gate 23 to one end of the resistor formed by poly-2 layer 25.

Although only the preferred embodiment of the invention has been described herein, it will be apparent to one skilled in the art that changes and modifications may be made thereto without departing from the spirit and scope of the invention as claimed.

I claim:

1. A process for interconnecting the poly-1 gate of an N-channel IGFET and the poly-1 gate of a P-channel IGFET with a high-value, poly-2, inter-nodal coupling resistor in order to create a CMOS inverter, said IGFETs having been fabricated on distinct active areas created on the upper surface of a silicon wafer substrate, said active areas being separated by a field oxide region, the gate of each IGFET extending beyond an edge of said field oxide region such that a an end portion of each gate is superjacent a portion of said field oxide region, said gates being separated by an expanse of exposed field oxide, on a portion of which expanse said resistor will be constructed, said process comprising the following sequence of steps:
   a) blanket deposition of a first silicon nitride layer on the upper surface of the wafer;
   b) blanket deposition of a poly-2 layer on top of the first nitride layer;
   c) doping the poly-2 layer to a desired sheet resistance;
   d) masking the doped poly-2 layer with photoresist in order to define a strip of doped poly-2 material having a pair of end regions, said strip being entirely superjacent said field oxide region, yet not in contact with either of said gates;
   e) etching away unmasked portions of the doped poly-2 layer, leaving the doped poly-2 strip;
   f) stripping the photoresist used to mask the poly-2 layer;
   g) creating a silicide isolation layer of silicon dioxide on top of a portion of the doped poly-2 strip that is to become the resistive component of the coupling resistor;
   h) etching away all silicon nitride that is not subjacent the doped poly-2 strip;

i) blanket deposition of a metallic titanium layer on the upper surface of the wafer;

j) sintering the titanium layer in a nitrogen ambient;

k) blanket deposition of a patterning silicon dioxide layer on the upper surface of the wafer;

l) masking the patterning silicon dioxide layer with photoresist to define a local interconnect pattern which will connect each gate to only one end portion of said poly-2 strip;

m) etching away unmasked portion of the patterning silicon dioxide layer;

n) stripping the photoresist used to define the local interconnect pattern;

o) etching away titanium nitride that was exposed by etching away portions of the patterning silicon dioxide layer; and p) annealing the sintered titanium layer remnants.

2. The process of claim 1, wherein the creation of said silicide isolation layer of silicon dioxide is accomplished via oxide decomposition.

3. The process of claim 2, wherein the creation of said silicide isolation layer via oxide decomposition is accomplished with the following sequence of steps:

a) blanket decomposition of a TEOS oxide layer on the upper surface of the wafer;

b) masking the TEOS oxide layer with photoresist to define said resistive component;

c) etching away unmasked portions of the TEOS oxide layer; and d) stripping the photoresist used to mask the TEOS oxide layer.

4. The process of claim 1, wherein the creation of said silicide isolation layer of silicon dioxide is accomplished by oxidizing a portion of the upper surface of poly-2 strip.

5. The process of claim 4, wherein the creation of said silicide isolation layer via the oxidation of a portion of the upper surface of the doped poly-2 strip is accomplished with the following sequence of steps:

a) blanket deposition of a second nitride layer on the upper surface of the wafer;

b) masking said second nitride layer with photoresist such that the portion of said strip corresponding to said resistive component is unmasked;

c) etching away the unmasked portion of the second nitride layer to expose said resistive component of the poly-2 strip;

d) stripping the photoresist used to mask said second nitride layer; and e) growing high-pressure oxide on the portion of the poly-2 strip which was exposed by the etch of the second nitride layer.

* * * * *

UNITED STATES PATENT AND TRADEMARK OFFICE
CERTIFICATE OF CORRECTION

PATENT NO. : 5,135,882
DATED : August 4, 1992
INVENTOR(S) : J. Karniewicz

It is certified that error appears in the above-indentified patent and that said Letters Patent is hereby corrected as shown below:

Column 2, line 67, after "then", please insert -- departs --.

Column 3, line 58, after "strip", please insert -- ; --.

Column 4, line 56, after "essentially,", please insert -- a --.

Column 7, line 22, delete "decomposition" and insert -- deposition --.

Column 7, line 24, delete "decomposition" and insert -- deposition --.

Column 7, line 26, delete "decomposition" and insert -- deposition --.

Signed and Sealed this

First Day of March, 1994

Attest:

BRUCE LEHMAN

Attesting Officer  Commissioner of Patents and Trademarks